(12) United States Patent
Karlsson et al.

(10) Patent No.: US 6,984,569 B2
(45) Date of Patent: Jan. 10, 2006

(54) SHALLOW TRENCH ISOLATION (STI) REGION WITH HIGH-K LINER AND METHOD OF FORMATION

(75) Inventors: Olov B. Karlsson, San Jose, CA (US); HaiHong Wang, Fremont, CA (US); Bin Yu, Cupertino, CA (US); Zoran Krivokapic, Santa Clara, CA (US); Qi Xiang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 88 days.

(21) Appl. No.: 10/642,916

(22) Filed: Aug. 18, 2003

(65) Prior Publication Data

US 2005/0073022 A1    Apr. 7, 2005

Related U.S. Application Data

(62) Division of application No. 10/163,925, filed on Jun. 6, 2002, now Pat. No. 6,657,276.

(60) Provisional application No. 60/340,001, filed on Dec. 10, 2001.

(51) Int. Cl.
*H01L 21/8224*    (2006.01)

(52) U.S. Cl. .................. 438/424; 438/436; 438/435; 438/437

(58) Field of Classification Search ............. 438/424, 438/436, 435, 437, 438, 439, 221, 296, 353; 257/510, 506, 508, 513
See application file for complete search history.

(56) References Cited

U.S. PATENT DOCUMENTS

| | | |
|---|---|---|
| 5,811,347 A | 9/1998 | Gardner |
| 5,989,978 A * | 11/1999 | Peidous ..................... 438/436 |
| 6,008,095 A * | 12/1999 | Gardner et al. ............. 438/296 |
| 6,013,553 A | 1/2000 | Wallace et al. |
| 6,020,024 A | 2/2000 | Maiti et al. |
| 6,074,899 A | 6/2000 | Voldman |
| 6,313,008 B1 | 11/2001 | Leung et al. |
| 6,313,011 B1 | 11/2001 | Nouri |
| 6,465,866 B2 * | 10/2002 | Park et al. .................. 257/510 |
| 6,498,383 B2 | 12/2002 | Beyer |
| 6,657,267 B1 * | 12/2003 | Xiang et al. ................ 257/410 |
| 6,657,276 B1 * | 12/2003 | Karlsson et al. ............ 257/510 |
| 6,730,576 B1 * | 5/2004 | Wang et al. ................ 438/413 |
| 6,747,333 B1 * | 6/2004 | Xiang et al. ................ 257/510 |
| 6,762,483 B1 * | 7/2004 | Krivokapic et al. ......... 257/618 |
| 6,784,101 B1 * | 8/2004 | Yu et al. ..................... 438/666 |
| 6,812,119 B1 * | 11/2004 | Ahmed et al. .............. 438/585 |
| 6,828,211 B2 * | 12/2004 | Chi ............................ 438/424 |
| 6,882,025 B2 * | 4/2005 | Yeo et al. .................... 257/510 |
| 6,894,363 B2 * | 5/2005 | Tamura ...................... 257/510 |
| 2002/0053715 A1 * | 5/2002 | Kim et al. ................... 257/524 |
| 2003/0067051 A1 * | 4/2003 | Tamura ...................... 257/510 |
| 2004/0121553 A1 * | 6/2004 | Tamura ...................... 438/424 |
| 2004/0142545 A1 * | 7/2004 | Ngo et al. ................... 438/585 |
| 2004/0212035 A1 * | 10/2004 | Yeo et al. .................... 257/510 |
| 2005/0035426 A1 * | 2/2005 | Ko et al. ..................... 257/510 |
| 2005/0073022 A1 * | 4/2005 | Karlsson et al. ............ 257/510 |

FOREIGN PATENT DOCUMENTS

| | | |
|---|---|---|
| EP | 0703628 A2 | 3/1996 |
| JP | 2004119649 A * | 4/2004 |

* cited by examiner

*Primary Examiner*—Laura M. Schillinger
(74) *Attorney, Agent, or Firm*—Renner, Otto, Boisselle & Sklar, LLP

(57) ABSTRACT

A shallow trench isolation region formed in a layer of semiconductor material. The shallow trench isolation region includes a trench formed in the layer of semiconductor material, the trench being defined by sidewalls and a bottom; a liner within the trench formed from a high-K material, the liner conforming to the sidewalls and bottom of the trench; and a fill section made from isolating material, and disposed within and conforming to the high-K liner. A method of forming the shallow trench isolation region is also disclosed.

10 Claims, 2 Drawing Sheets

SHALLOW TRENCH ISOLATION (STI) REGION WITH HIGH-K LINER AND METHOD OF FORMATION

RELATED APPLICATION DATA

This application is a divisional application of U.S. patent application Ser. No. 10/163,925, filed Jun. 6, 2002 now U.S. Pat. No. 6,657,276, which claims the benefit of U.S. Provisional Application Ser. No. 60/340,001 filed Dec. 10, 2001, the disclosures of which are incorporated herein by reference in their entireties.

TECHNICAL FIELD

The present invention relates generally to semiconductor devices and the fabrication thereof and, more particularly, to shallow trench isolation (STI) regions for isolating one semiconductor device from another and a method of formation.

BACKGROUND

Typical semiconductor devices are formed using active regions of a wafer. The active regions are defined by isolations regions used to separate and electrically isolate adjacent semiconductor devices. For example, in an integrated circuit having a plurality of metal oxide semiconductor field effect transistors (MOSFETs), each MOSFET has a source and a drain that are formed in an active region of a semiconductor layer by implanting N-type or P-type impurities in the layer of semiconductor material. Disposed between the source and the drain is a channel (or body) region. Disposed above the body region is a gate electrode. The gate electrode and the body are spaced apart by a gate dielectric layer. It is noted that MOSFETs can be formed in bulk format (for example, the active region being formed in a silicon substrate) or in a semiconductor-on-insulator (SOI) format (for example, in a silicon film that is disposed on a insulating layer that is, in turn, disposed on a silicon substrate).

As indicated, the active regions of each semiconductor device, MOSFET or otherwise, are often separated by isolation regions. One technique for forming isolation regions is local oxidation of silicon (LOCOS). LOCOS involves depositing a non-oxidizable mask, such as silicon nitride over a thin layer of oxide grown on a blank silicon wafer. The mask is patterned using photolithography and then the wafer is thermally oxidized. Following oxidation, mesa-like regions of silicon are formed that are surrounded by silicon oxide insulation. The active devices are then formed using the silicon mesas. Another technique is deep trench isolation (DTI). DTI has primarily been used for forming isolation regions between bipolar transistors.

Another technique for the formation of isolation regions is shallow trench isolation (STI). STI involves forming trenches in a layer of silicon and then filling the trenches with silicon oxide. Alternatively, the trenches can be lined with a silicon oxide liner formed by a thermal oxidation process and then filled with additional silicon oxide or another material, such as polysilicon. These "filled" trenches define the size and placement of the active regions.

A pervasive trend in modern integrated circuit manufacture is to produce semiconductor devices, (including, for example, MOSFETs, other types of transistors, memory cells, and the like) that are as small as possible. It is also advantageous to reduce the scale of the isolation regions that are formed between the devices. Although the fabrication of smaller devices and isolation regions allows more devices to be placed on a single monolithic substrate for the formation of relatively large circuit systems in a relatively small die area, this downscaling can result in a number of performance degrading effects. For example, relatively narrow STI regions (e.g., about 180 Å or less) formed using conventional techniques have a tendency lose their ability to isolate adjacent devices.

Accordingly, there exists a need in the art for improved isolation between semiconductor devices and for techniques of fabricating improved isolation regions along with semiconductor devices.

SUMMARY OF THE INVENTION

According to one aspect of the invention, a shallow trench isolation region formed in a layer of semiconductor material is provided. The shallow trench isolation region includes a trench formed in the layer of semiconductor material, the trench being defined by sidewalls and a bottom; a liner within the trench formed from a high-K material, the liner conforming to the sidewalls and bottom of the trench; and a fill section made from isolating material, and disposed within and conforming to the high-K liner.

According to another aspect of the invention, a method of forming a shallow trench isolation region in a layer of semiconductor material is provided. The method includes forming a trench in the layer of semiconductor material, the trench having sidewalls and a bottom; forming a layer of high-K material, the layer of high-K material conforming to the sidewalls and the bottom of the trench to line the trench with a high-K liner; and filling the high-K material lined trench with an isolating material.

BRIEF DESCRIPTION OF DRAWINGS

These and further features of the present invention will be apparent with reference to the following description and drawings, wherein.

DISCLOSURE OF INVENTION

Figure 1:
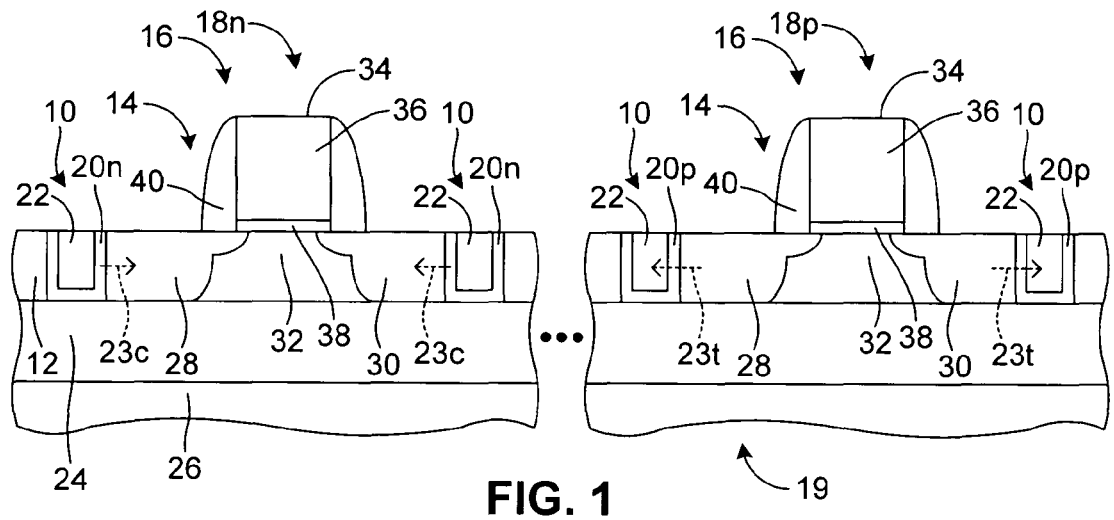
FIG. 1 is a schematic block diagram of exemplary semiconductor devices separated by isolation regions according to the present invention.

In the detailed description that follows, identical components have been given the same reference numerals, regardless of whether they are shown in different embodiments of the present invention. To illustrate the present invention in a clear and concise manner, the drawings may not necessarily be to scale and certain features may be shown in somewhat schematic form.

Certain aspects of the present invention relate to shallow trench isolation (STI) regions for providing electrical isolation between semiconductor devices and for improving electron/hole mobility in semiconductor devices neighboring the isolation regions. Methods for fabricating the STI regions are also discussed. Example semiconductor devices that can be separated by the STI regions described herein include metal oxide semiconductor field effect transistors (MOSFETs). These MOSFETs can, for example, be used in the construction of a complimentary metal oxide semiconductor (CMOS) integrated circuit that includes PMOS devices (P-channel devices) and NMOS devices (N-channel devices). However, one skilled in the art will appreciate that other types of semiconductor devices (e.g., memory cells, other types of transistors and the like) can also benefit from being separated by the isolation regions described herein. Therefore, the MOSFET devices illustrated herein are merely exemplary.

With reference to FIG. 1, a plurality of isolation regions 10 formed in a layer of semiconductor material 12 is illustrated. The isolation regions 10 define the size and placement of active regions 14, from which semiconductor devices 16 can be constructed. In the illustrated embodiment, the semiconductor devices 16 are MOSFETs. Thus, the semiconductor devices 16 will sometimes be referred to herein as MOSFETs 18. The illustrated MOSFETs 18 include an NMOS device 18*n* and a PMOS device 18*p*. Accordingly, FIG. 1 illustrates a portion of a wafer 19 having a plurality of semiconductor devices 16 and isolation regions 10 formed thereon.

The isolation regions 10 each include a liner 20 made from a high-K material and a fill section 22 made from a material, such as silicon oxide (e.g., $SiO_2$), silicon nitride (SiN), polysilicon, or other suitable material. The fill section 22 can be formed by chemical vapor deposition (CVD). The fill section 22 is disposed within and conforms to the liner 20. The liner 20 acts as a barrier between the layer of semiconductor material and the fill section 22.

High-K materials are discussed in greater detail below. However, for purposes herein, the term "high-K material" or "high-K dielectric material" refers to a material, or stack of materials, having a relative permittivity, or K, in one embodiment of about ten (10) or more, and in another embodiment of about twenty (20) or more. Relative permittivity is the ratio of the absolute permittivity ($\in$) found by measuring capacitance of the material to the permittivity of free space ($\in_o$) that is $K=\in/\in_o$. In addition, all binary and ternary metal oxides and ferroelectric materials having a K higher than, in one embodiment, about twenty (20) can be used for the liner 20. As used herein, a standard-K dielectric material refers to a dielectric material having a relative permittivity, or K, of up to about ten (10). Example standard-K dielectric materials include, for example, silicon dioxide (K of about 3.9), silicon oxynitride (K of about 4 to 8 depending on the relative content of oxygen and nitrogen) and silicon nitride (K of about 6 to 9).

The high-K material used for the liner 20 is stressed to improve electron/hole mobility in neighboring semiconductor devices 16. More specifically, in isolation regions 10 adjacent NMOS devices 18*n*, the liners 20*n* are under compressive stress to compress the active region 14 of the NMOS device 18*n* as indicated by arrows 23*c*. Without intending to be bound by theory, this compression is believed to improve electron transport within the NMOS device 18*n* (n-channel devices being dominated by electron transport). In isolation regions 10 adjacent PMOS devices 18*p*, the liners 20*p* are under tensile stress to stretch the active region 14 of the PMOS device 18*p* as indicated by arrows 23*t*. Without intending to be bound by theory, these tensile forces is believed to improve hole transport within the PMOS device 18*p* (p-channel devices being dominated by hole transport).

Due to inherent properties of many high-K materials, the compressive and tensile stresses described herein can be achieved by appropriate material selection. In addition, stress can be controlled by thermal and/or mechanical techniques. Also, stress can be controlled by the method used to deposit the high-K material.

The fill section 22 can also be formed to have a compressive or tensile stress. However, most appropriate fill section materials will have a tendency to have compressive stress.

Often, PMOS devices 18*p* and NMOS devices 18*n* are disposed adjacent one another and are separated by one of the isolation regions 10. In this situation, the designer can select which one of the PMOS device 18*p* or the NMOS device 18*n* that will be better served by enhanced electron/hole mobility and use an appropriate high-K material for the liner 20 in the isolation region 10 separating the PMOS device 18*p* and NMOS device 18*n*. Alternatively, this isolation region 10 can be formed with a neutral stress or a reduced stress, and, if appropriate, other isolation regions 10 surrounding the PMOS device 18*p* and/or the NMOS device 18*n* can be formed with the stress components described herein.

In one embodiment, the liner 20 can have a thickness of about 50 Å to about 500 Å, and in another embodiment the liner 20 can have a thickness of about 100 Å to about 200 Å. The thickness of the liner 20 will primarily depend on the exact material used, the K value of the material used, and the stress properties of the material used. Overall, the isolation region 10 can be, for example, about 0.1 $\mu$m to about 1.0 $\mu$m wide.

The use of a high-K liner 20 for the isolation region 10 is also advantageous since the high-K material has improved barrier (and hence isolation) properties over standard-K materials. In addition, high-K material layers also tend to have good corner rounding when deposited as a conformal layer. Such corner rounding facilitates conformance of the fill section 22 within the liner 20.

Focusing on one isolation region 10 in cross-section, the liner 20 is a conformal layer formed along sidewalls and a bottom of a trench that defines the isolation region 10. The trench is formed in the layer of semiconductor material 12. It is noted that in the illustrated embodiment of FIG. 1, the layer of semiconductor material 12 is a semiconductor film (such as silicon, germanium, silicon-germanium, stack of semiconductor materials, etc.) formed on a layer of insulating material 24. The insulating layer 24 is, in turn, formed on a semiconductor substrate 26 so that the resultant semiconductor devices 16 are formed in a semiconductor-on-insulator (SOI) format, as is well known in the art. The bottom of the trench in the illustrated example is defined by the insulating layer 24.

Alternatively, the layer of semiconductor material 12 can be, for example, a silicon substrate for the formation of bulk-type devices.

The MOSFETs 18 are formed using respective active regions 14 disposed between adjacent sets of isolation regions 10. Each MOSFET 18 includes a source 28, a drain 30 and a body 32 disposed between the source 28 and the drain 30. In the illustrated embodiment, the source 28 and the drain 30 each include a deep doped region and an extension region as illustrated. Each MOSFET 18 also includes a gate 34. The gate 34 is disposed on the layer of semiconductor material 12 over the body 32 and defines a channel within the body 32 (the channel being interposed between the source 28 and the drain 30).

The gate 34 includes a gate electrode 36 spaced apart from the layer of semiconductor material 12 by a gate dielectric 38. The gate dielectric 38 can be made from a high-K material (such as, for example, $HfO_2$, $ZrO_2$, $CeO_2$, $Al_2O_3$, TiO$_2$ or YO$_2$), a stack of materials that includes at least one high-K material layer or a layer of standard-K material.

As illustrated, the extensions may laterally diffuse a short distance under the gate 38, as is known in the art. In addition, sidewall spacers 40 can be used to assist in defining the placement of the deep implants.

Figure 2:
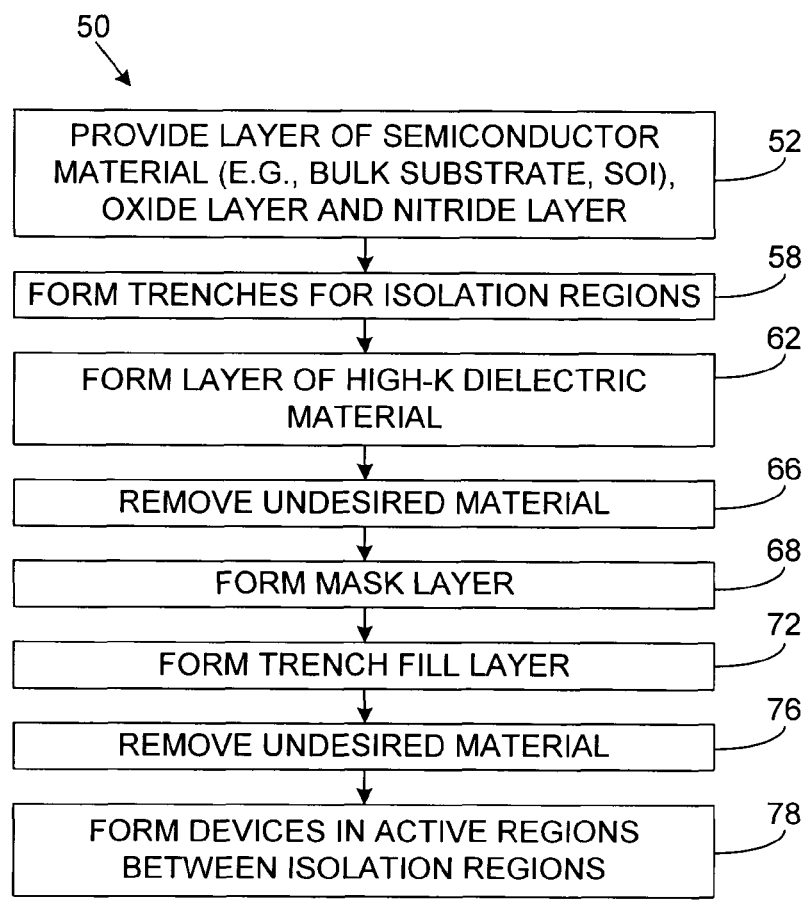
FIG. 2 is a flow chart illustrating a method for forming the isolation regions and for forming the exemplary semiconductor devices.
Figure 3A:
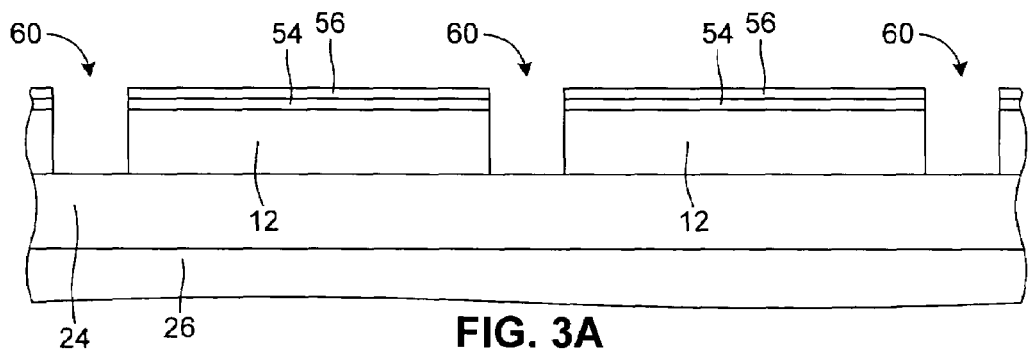
FIGS. 3A through 3D illustrate the isolation regions of FIG. 1 in various stages of manufacture.

Referring now to FIG. 2, a method 50 of forming the isolation regions 10 is illustrated. With additional reference to FIG. 3A, the method 50 starts in step 52 where the layer of semiconductor material 12 is provided. As indicated above, the layer of semiconductor material 12 can be a semiconductor substrate (such as a silicon substrate) for the formation of bulk-type devices. However, in the illustrated example, the layer of semiconductor material 12 is a semiconductor film (such as a silicon film or a silicon-germanium film) formed as part of a SOI substrate stack.

A thin layer of thermally grown oxide 54 (for example, silicon oxide when the layer of semiconductor material 12 is silicon) can be provided on the layer of semiconductor material 12 as is often conventionally found in the fabrication of a wafer 19 with semiconductor devices 16 disposed thereon. In addition, a nitride layer 56 (for example, silicon nitride (SiN) can be formed on the oxide layer 54 as is also known in the art. Depending on the composition of the layer of semiconductor material 12 and other design considerations, the materials used for the oxide layer 54 and/or the nitride layer 56 can differ, or one or both of the oxide layers 54 and the nitride layer 56 can be omitted. As will be discussed in greater detail below, the nitride layer 56 acts as a stop layer for subsequent material removal steps (e.g., by chemical-mechanical planarization (CMP)).

Next, in step 58, shallow trenches 60 are formed in the layer of semiconductor material 12. Formation of trenches 60 is generally well known by those with ordinary skill in the art and will not be described in great detail. Briefly, the trenches 60 can be formed using various techniques, such as, for example, reactive ion etching. In the illustrated embodiment, the layer of semiconductor material 12 is selectively etched to the insulating layer 24. If the layer of semiconductor material 12 is a bulk semiconductor substrate, the layer of semiconductor material 12 can be etched to a selected depth. In the illustrated examples, the trench 60 sidewalls are vertical. However, the sidewalls can be non-parallel to one another (e.g., one or both sidewalls being beveled), curved or of other geometry.

Figure 3B:
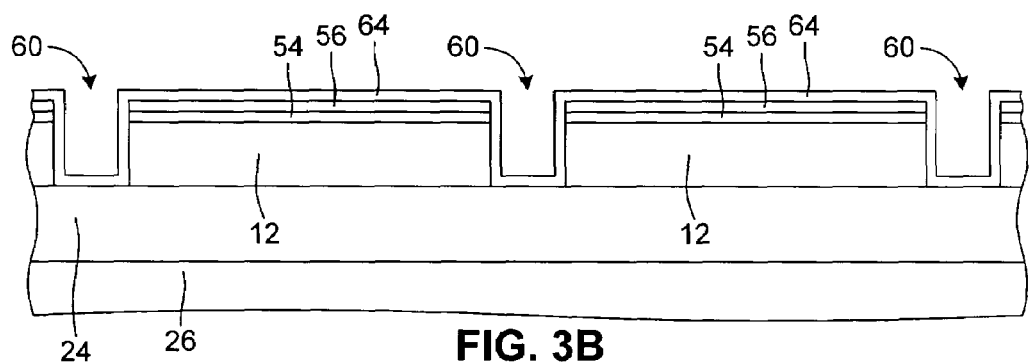

Thereafter, in step 62 and with additional reference to FIG. 3B, a high-K material layer 64 is grown or deposited to conform to the wafer 19. More particularly, the high-K material layer 64 is formed to conform to the trench 60 sidewalls and bottom, and on top of the nitride layer 56.

Exemplary high-K materials are identified below in Table 1. It is noted that Table 1 is not an exhaustive list of high-K materials and other high-K materials may be available.

TABLE 1

| Dielectric Material | Approximate Relative Permittivity (K) |
|---|---|
| aluminum oxide (Al$_2$O$_3$) | 9–10 |
| zirconium silicate | 12 |
| hafnium silicate | 15 |
| hafnium silicon oxynitride | 16 |
| hafnium silicon nitride | 18 |
| lanthanum oxide (La$_2$O$_3$) | 20–30 |
| hafnium oxide (HfO$_2$) | 40 |
| zirconium oxide (ZrO$_2$) | 25 |
| cerium oxide (CeO$_2$) | 26 |

TABLE 1-continued

| Dielectric Material | Approximate Relative Permittivity (K) |
|---|---|
| bismuth silicon oxide (Bi$_4$Si$_2$O$_{12}$) | 35–75 |
| titanium dioxide (TiO$_2$) | 30 |
| tantalum oxide (Ta$_2$O$_5$) | 26 |
| tungsten oxide (WO$_3$) | 42 |
| yttrium oxide (Y$_2$O$_3$) | 20 |
| lanthanum aluminum oxide (LaAlO$_3$) | 25 |
| barium strontium titanate (Ba$_{1-x}$Sr$_x$TiO$_3$) | ~20–~200 |
| barium strontium oxide (Ba$_{1-x}$Sr$_x$O$_3$) | ~20–~200 |
| PbTiO$_3$ | ~20–~200 |
| barium titanate (BaTiO$_3$) | ~20–~200 |
| strontium titanate SrTiO$_3$ | ~20–~200 |
| PbZrO$_3$ | ~20–~200 |
| PST (PbSc$_x$Ta$_{1-x}$O$_3$) | 3000 |
| PZN (PbZn$_x$Nb$_{1-x}$O$_3$) | ~500–~5000 |
| PZT (PbZr$_x$Ti$_{1-x}$O$_3$) | ~150–~1000 |
| PMN (PbMg$_x$Nb$_{1-x}$O$_3$) | ~500–~5000 |

It is noted that the K-values for both standard-K and high-K materials may vary to some degree depending on the exact nature of the dielectric material. Thus, for example, differences in purity, crystallinity and stoichiometry, may give rise to variations in the exact K-value determined for any particular dielectric material.

As used herein, when a material is referred to by a specific chemical name or formula, the material may include non-stoichiometric variations of the stoichiometrically exact formula identified by the chemical name. For example, tantalum oxide, when stoichiometrically exact, has the chemical formula Ta$_2$O$_5$, but may include variants of stoichiometric Ta$_2$O$_5$, which may be referred to as Ta$_x$O$_y$, in which either of x or y vary by a small amount. For example, in one embodiment, x may vary from about 1.5 to 2.5, and y may vary from about 4.5 to about 5.5. In another embodiment, x may vary from about 1.75 to 2.25, and y may vary from about 4 to about 6. Such variations from the exact stoichiometric formula fall within the definition of tantalum oxide. Similar variations from exact stoichiometry for all chemical names or formulas used herein are intended to fall within the scope of the present invention. For example, again using tantalum oxide, when the formula Ta$_2$O$_5$ is used, Ta$_x$O$_y$ is included within the meaning. Thus, in the present disclosure, exact stoichiometry is intended only when such is explicitly so stated. As will be understood by those of skill in the art, such variations may occur naturally, or may be sought and controlled by selection and control of the conditions under which materials are formed.

Figure 3C:
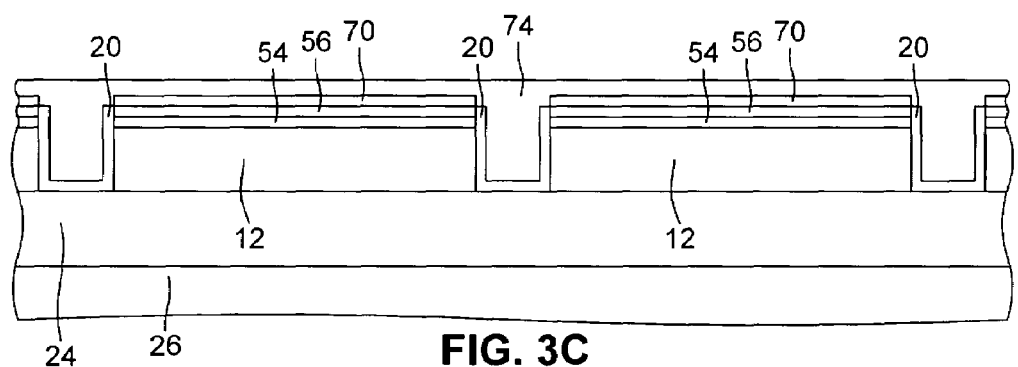

With reference to FIGS. 2 and 3C, the method 50 continues in step 66 where any undesired portions of the high-K material layer 64 are removed. For example, CMP can be used to polish off high-K material disposed on the nitride layer 56. It is noted that the removal step 66 is optional if removal of the high-K material is not desired. Alternatively, the removal step 66 can be deferred until later in the method 50 and/or combined with other another processing step(s).

Thereafter, in step 68, a mask layer 70 is formed over the nitride layer 56. The mask layer 64 can also be a nitride, such as silicon nitride (SiN), or other suitable material (e.g., a non-oxidizing material). Therefore, if the nitride layer 56 is of suitable composition and thickness, the formation of the mask layer 70 is optional. The mask layer 70, when initially formed, can fill the high-K material lined trenches 60 and can cover the rest of the nitride layer 56. The mask layer 70 can then be patterned to expose the high-K material lined trenches 60 as illustrated.

Next, in step 72, a layer of fill material 74 is deposited to fill the high-K material lined trenches 60. As will become more apparent below, the layer of fill material 74 serves to become the fill sections 22. The layer of fill material 74 can also cover the mask layer 70. As indicated above, the layer of fill material 74 can be, for example, silicon oxide (e.g., $SiO_2$) formed by a technique such as CVD. However, other appropriate materials having isolating properties (e.g., silicon nitride or polysilicon) and/or other techniques for depositing or growing the layer of fill material 74 can be used.

The mask layer 70, and/or the nitride layer 56, is used to assist in patterning the layer of fill material 74 (as discussed in greater detail below with respect to step 76). The mask layer 70 also can be used to assist in minimizing reaction between the reagents used to form the layer of fill material 74 and other layers, such as the layer of semiconductor material 12, during formation of the layer of fill material 74.

Figure 3D:
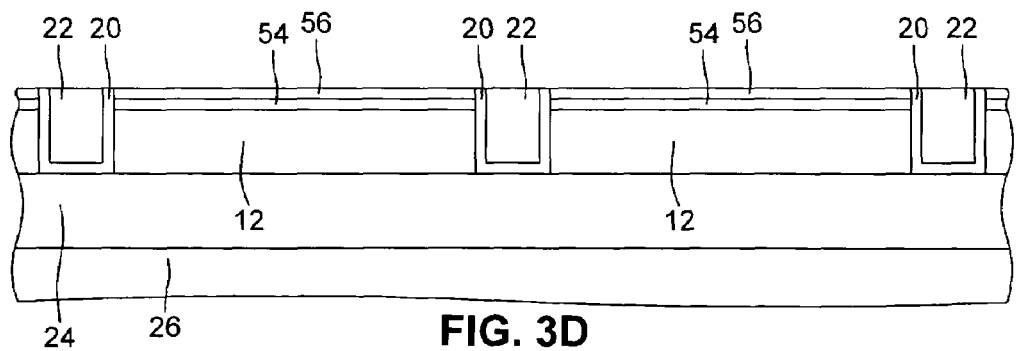

Thereafter, in step 76 and with additional reference to FIG. 3D, undesired material is removed from the wafer 19. More specifically, portions of the layer of fill material 74 not disposed within the high-K material lined trenches can be removed. Also, the mask layer 70, the nitride layer 56 and/or the oxide layer 54 can be removed. Techniques such as CMP, wet etching, dry etching or another appropriate technique can be used in the removal of undesired material. In one embodiment, the nitride layer 56 is used as a stop layer for CMP removal of the layer of fill material 74 and any other layers formed on the nitride layer 56.

Following step 76, the semiconductor devices 16 can be formed in step 78. With reference to FIG. 1, where the exemplary semiconductor devices 16 are MOSFETs 18, a layer of material used to form the gate dielectrics 38 can be formed. Thereafter, a gate electrode 36 for each MOSFET 18 can be formed on the layer of material used to form the gate dielectrics 38 between the isolation regions 10 as is well known in the art. The material used to form the gate electrode 36 can be, for example, polysilicon, polysilicon-germanium, titanium-nitride (e.g., TiN), tungsten (W), tantalum nitride (e.g., TaN, $Ta_3N_5$) or any other desired material.

After the gate electrode 36 is formed, the extensions can be implanted. Formation of shallow source 28 and drain 30 extensions, such as by using a lightly doped drain (LDD) technique, is well known in the art and will not be described in detail herein. Briefly, for a P-type extension region, ions such as boron, gallium or indium, can be implanted with an energy of about 1.0 KeV to about 3.0 KeV and a dose of about $1\times10^{14}$ atoms/cm$^2$ to about $1\times10^{15}$ atoms/cm$^2$. For an N-type extension region, ions such as antimony, phosphorous or arsenic, can be implanted at an energy of about 0.3 KeV to about 1.5 KeV and a dose of about $1\times10^{14}$ atoms/cm$^2$ to about $1\times10^{16}$ atoms/cm$^2$. Following dopant implantation, a thermal anneal cycle is carried out to recrystallize the layer of semiconductor material 12 at a temperature of about 600° C. to about 850° C. Alternatively, the extensions can be formed using a solid phase epitaxy (SPE) process, especially when a lower temperature anneal cycle (e.g., about 600° C.) is desired. More specifically, SPE is used to amorphize the layer of semiconductor material 12 with an ion species, such as silicon, germanium, xenon, or the like. The energy and dosage of the ion species can be determined empirically for the device being fabricated. Next, dopant is implanted as described above to achieve the desired N-type or P-type doping and then the layer of semiconductor material 12 is recrystallized using a low temperature anneal (i.e., at a temperature of less than about 700° C.). The ions used to form the extensions may diffuse slightly under the gate 34 as is conventional.

Other processing in step 78 can include formation of the sidewall spacers 40.

The spacers 40 can be formed from a material such as a nitride (e.g., silicon nitride, or $Si_3N$). The formation of the spacers 40 is well known in the art and will not be described in greater detail.

The spacers 40 and the gate 34 act as a self-aligned mask for implantation of the deep doped regions. Implanting dopant species to form the deep doped regions of the source 28 and the drain 30, respectively, is well known in the art and will not be described in great detail herein. Briefly, to form a P-type deep doped region, ions such as boron, gallium or indium, can be implanted with an energy of about 5 KeV to 30 KeV and a dose of about $1\times10^{15}$ atoms/cm$^2$ to about $5\times10^{15}$ atoms/cm$^2$. N-type deep doped regions can be formed by implanting ions, such as antimony, phosphorous or arsenic, at an energy of about 3 KeV to about 15 KeV and a dose of about $1\times10^{15}$ atoms/cm$^2$ to about $1\times10^{16}$ atoms/cm$^2$. Following implantation of the deep doped source and drain regions, an anneal cycle is carried out to recrystallize the layer of semiconductor material 12 at a high temperature of, for example, about 950° C. to about 1,000° C. Alternatively, an SPE process similar to that described for the formation of the extensions can be used in the formation of the deep doped regions. It is noted that the ions used to form the deep doped regions may laterally diffuse slightly under the spacers 40 as is conventional.

Other additional processing can include for example, the formation of a source 20 contact, a drain 22 contact and a gate electrode 36 contact. An oxide cap can also be formed. If desired, the contacts can be formed using a silicidation process as is known in the art. Prior to extension implantation, spacer formation, deep doped region implantation and/or contact formation, the layer of material used to form the gate dielectrics 38 can be patterned.

The method 50 shows in a specific order of steps for fabricating the isolation regions 10 and the semiconductor devices 16. However, it is understood that the order may differ from that depicted. For example, the order of two or more steps may be altered relative to the order shown. Also, two or more steps may be carried out concurrently or with partial concurrence. In addition, various steps may be omitted and other steps may be added. It is understood that all such variations are within the scope of the present invention.

Although particular embodiments of the invention have been described in detail, it is understood that the invention is not limited correspondingly in scope, but includes all changes, modifications and equivalents coming within the spirit and terms of the claims appended hereto.

What is claimed is:

1. A method of enhancing carrier mobility in a semiconductor active region of a semiconductor device having a predetermined channel type of either n-channel type or p-channel type, comprising:

selecting an appropriate one of compressive stress or tensile stress that when exerted on the active region will enhance carrier mobility within the active region for the channel type of the semiconductor device;

providing a layer of semiconductor material; and providing a trench isolation region in the layer of semiconductor region that defines placement of the active region, the trench isolation region defined by sidewalls and a bottom and the providing the trench isolation region includes:

providing a liner that exerts the selected one of compressive stress or tensile stress on the active region, the liner made from a material having a relative permittivity (K) of about 10 or more and conforming to the sidewalk and bottom; and providing a fill section made from isolating material that is disposed within and conforms to the liner.

2. The method according to claim 1, further comprising forming the semiconductor device using an active region and wherein the liner exerts compressive stress to compress the active region, the compressive stress effective to enhance electron mobility within the active region.

3. The method according to claim 2, wherein the semiconductor device is an NMOS device.

4. The method according to claim 1, further comprising forming the semiconductor device using an active region and wherein the liner exerts tensile stress to strain the active region, the tensile stress effective to enhance hole mobility within the active region.

5. The method according to claim 4, wherein the semiconductor device is a PMOS device.

6. The method according to claim 1, wherein the fill section is composed of one or more materials selected from silicon oxide, silicon nitride, polysilicon and mixtures thereof.

7. The method according to claim 6, wherein the fill section is deposited using chemical vapor deposition (CVD).

8. The method according to claim 1, wherein the layer of semiconductor material is a semiconductor film disposed on an insulating layer, the insulting layer being disposed on a semiconductor substrate.

9. The method according to claim 8, wherein the bottom of the trench is defined by the insulating layer.

10. The method according to claim 1, wherein the liner has a relative permittivity (K) of about 20 or more.

* * * * *

UNITED STATES PATENT AND TRADEMARK OFFICE
CERTIFICATE OF CORRECTION

PATENT NO. : 6,984,569 B2
DATED : January 10, 2006
INVENTOR(S) : Karlsson et al.

It is certified that error appears in the above-identified patent and that said Letters Patent is hereby corrected as shown below:

Column 3,
Line 38, replace "space ($\in_0$) that is K" with -- space ($\in_0$), that is K --.

Column 9,
Line 5, replace "the sidewalk and" with -- the sidewalls and --.

Signed and Sealed this

Seventh Day of March, 2006

JON W. DUDAS
*Director of the United States Patent and Trademark Office*